US009130315B2

(12) United States Patent
O'Malley et al.

(10) Patent No.: US 9,130,315 B2
(45) Date of Patent: Sep. 8, 2015

(54) CIRCUIT MEMBER WITH ENHANCED PERFORMANCE

(75) Inventors: Brian P. O'Malley, Naperville, IL (US); Michael R. Kamarauskas, Bartlett, IL (US); Timothy R. McClelland, Bolingbrook, IL (US); Emanuel G. Banakis, Naperville, IL (US); Johnny Chen, Danville, CA (US); Kent E. Regnier, Lombard, IL (US)

(73) Assignee: Molex Incorporation, Lisle, IL (US)

( * ) Notice: Subject to any disclaimer, the term of this patent is extended or adjusted under 35 U.S.C. 154(b) by 253 days.

(21) Appl. No.: 13/508,249

(22) PCT Filed: Nov. 4, 2010

(86) PCT No.: PCT/US2010/055441
§ 371 (c)(1),
(2), (4) Date: Aug. 28, 2012

(87) PCT Pub. No.: WO2011/056968
PCT Pub. Date: May 12, 2011

(65) Prior Publication Data

US 2012/0309233 A1 Dec. 6, 2012

Related U.S. Application Data

(60) Provisional application No. 61/258,983, filed on Nov. 6, 2009, provisional application No. 61/267,128, filed on Dec. 7, 2009, provisional application No. 61/267,207, filed on Dec. 7, 2009.

(51) Int. Cl.

| | |
|---|---|
| ***H01R 24/28*** | (2011.01) |
| ***H05K 1/11*** | (2006.01) |
| ***H03H 7/00*** | (2006.01) |
| ***H01R 13/66*** | (2006.01) |

(Continued)

(52) U.S. Cl.
CPC ............ *H01R 13/66* (2013.01); *H01R 13/6469* (2013.01); *H01R 13/6633* (2013.01); *H01R 2107/00* (2013.01)

(58) Field of Classification Search
CPC ............... H01R 13/6469; H01R 13/66; H01R 2107/00; H01R 13/6633
USPC ............................ 439/668, 676, 69, 74, 626; 361/792–795; 174/262–266
See application file for complete search history.

(56) References Cited

U.S. PATENT DOCUMENTS

| | | | |
|---|---|---|---|
| 6,159,039 | A | 12/2000 | Wu |
| 6,162,089 | A | 12/2000 | Costello et al. |

(Continued)

OTHER PUBLICATIONS

International Search Report for PCT/US2010/055441.

*Primary Examiner* — Briggitte R Hammond
(74) *Attorney, Agent, or Firm* — Stephen L. Sheldon

(57) ABSTRACT

An electrical connector includes a dielectric housing with a plurality of filtering modules therein. Each filtering module has a housing and a magnetics assembly including transformer cores with wires wrapped therearound. An array of pins extend from the module housing for connection to the wires. A plurality of tails extend from the module housing for interconnection to a circuit board upon which the connector may be mounted. An interconnection is provided between the pins and tails that may include filtering or other signal modifying circuitry. A circuit member having an enhanced layout is also provided for use in or upon which the connector may be mounted.

13 Claims, 14 Drawing Sheets

(51) Int. Cl.
*H01R 13/6469* (2011.01)
*H01R 107/00* (2006.01)

(56) References Cited

U.S. PATENT DOCUMENTS

| | | | |
|---|---|---|---|
| 6,206,725 | B1 | 3/2001 | Wu |
| 6,302,741 | B1 | 10/2001 | Fasold et al. |
| 6,511,348 | B1 | 1/2003 | Wojtacki et al. |
| 6,537,110 | B1 | 3/2003 | Korsunsky et al. |
| 6,572,411 | B1 | 6/2003 | Aeschbacher et al. |
| 6,612,871 | B1 | 9/2003 | Givens |
| 6,641,440 | B1 | 11/2003 | Hyland et al. |
| 6,655,988 | B1 | 12/2003 | Simmons et al. |
| 6,659,807 | B1 | 12/2003 | Zheng et al. |
| 6,695,646 | B1 | 2/2004 | Grabbe |
| 6,699,071 | B1 | 3/2004 | Hyland |
| 6,702,610 | B2 | 3/2004 | Zheng et al. |
| 6,736,673 | B1 | 5/2004 | Simmons et al. |
| 6,743,047 | B2 | 6/2004 | Korsunsky et al. |
| 6,817,890 | B1 | 11/2004 | Schindler |
| 6,962,511 | B2 | 11/2005 | Gutierrez et al. |
| 7,033,210 | B1 | 4/2006 | Laurer et al. |
| 7,241,181 | B2 | 7/2007 | Machado et al. |
| 7,309,260 | B2 | 12/2007 | Brower et al. |
| 7,670,183 | B2 | 3/2010 | Huang et al. |
| 7,674,136 | B2 | 3/2010 | Steinke et al. |
| 7,712,941 | B2 | 5/2010 | Tai et al. |
| 8,284,007 | B1 | 10/2012 | Langner et al. |
| 8,333,599 | B2 | 12/2012 | Xu et al. |
| 2004/0002258 | A1 | 1/2004 | Zheng et al. |
| 2005/0255746 | A1 | 11/2005 | Hyland |
| 2006/0030221 | A1 | 2/2006 | Hyland et al. |
| 2009/0098766 | A1 | 4/2009 | Steinke et al. |
| 2009/0253293 | A1 | 10/2009 | Zhang |
| 2010/0015852 | A1 | 1/2010 | Xu et al. |

CIRCUIT MEMBER WITH ENHANCED PERFORMANCE

CROSS-REFERENCE TO RELATED APPLICATIONS

This patent application is a national phase of PCT Application No. PCT/US10/55441, filed Nov. 4, 2010, which in turn claims the benefit of U.S. Provisional Patent Application No. 61/258,983, filed Nov. 6, 2009, Application No. 61/267,128, filed Dec. 7, 2009, and Application No. 61/267,207, filed Dec. 7, 2009, all of which are incorporated herein by reference in their entirety.

BACKGROUND

The disclosure relates generally to layout of a circuit member and, more particularly, to a circuit member layout with enhanced performance.

Modular jack ("modjack") receptacle connectors mounted to printed circuit boards ("PCBs") are well known in the telecommunications industry. These connectors are often used for electrical connection between two electrical communication devices. With the ever-increasing operating frequencies and data rates of data and communication systems and the increased levels of encoding used to transmit information, the electrical characteristics of such connectors are of increasing importance. In particular, it is desirable that these modjack connectors do not negatively affect the signals transmitted and where possible, noise is removed from the system.

When used as Ethernet connectors, modjacks generally receive an input signal from one electrical device and then communicate a corresponding output signal to a second device coupled thereto. Magnetic circuitry can be used to provide conditioning and isolation of the signals as they pass from the first device to the second and typically such circuitry uses components such as a transformer and a choke. The transformer often is toroidal in shape and includes a primary and secondary wire coupled together and wrapped around a toroid so as to provide magnetic coupling between the primary and secondary wires while ensuring electrical isolation. Chokes are also commonly used to filter out unwanted noise, such as common-mode noise, and can be a toroidal ferrite used in differential signaling applications. Modjacks having such magnetic circuitry are typically referred to in the trade as magnetic jacks.

In some instances, the wires from one transformer and choke subassembly may impact the performance of adjacent subassemblies. As system data rates have increased, systems have become increasingly sensitive to cross-talk between ports and even between channels within a port. Magnetic subassemblies that operate within a predetermined range of electrical tolerances at one data rate (such as 1 Gbps) may be out of tolerance or inoperable at higher date rates (such as 10 Gbps). Accordingly, improving the isolation between the channels of the magnetic jacks has become desirable in order to permit a corresponding increase in the data rate of signals that pass through the system. Cross-talk and electro-magnetic radiation and interference between channels may impact the performance of the magnetic jack (and thus the entire system) as system speeds and data rates increase. Improvements in shielding and isolation between channels as well as simplifying the manufacturing process of a magnetic jack is thus desirable.

SUMMARY

An electrical connector includes a dielectric housing with a mating face and a module receiving face. The mating face includes a plurality of openings with each opening being configured to receive a mateable connector in a mating direction. The module receiving face is configured for receiving a plurality of filtering modules. Each filtering module has a housing, a magnetics assembly and a plurality of electrically conductive contacts. The magnetics assembly includes first, second, third and fourth transformer cores with each transformer core having a plurality of wires wrapped therearound to define respective first, second, third and fourth transformers. Two of the plurality of wires of each transformer define first and second signal conductors and two of the plurality of wires of each transformer are electrically connected and define a centertap of the transformer. The housing includes a first set of conductive pins extending from a lower surface configured for interconnection to a circuit board upon which the electrical connector may be mounted. The first set of conductive pins are arranged in first and second parallel, offset rows to define a staggered array of pins. The first and second signal conductors from each transformer are connected to pins in the first and second offsets rows. The centertap of the first transformer is electrically connected to a predetermined pin in the first row, the centertap of the second transformer is electrically connected to a predetermined pin in the second row, the centertap of the third transformer is electrically connected to a predetermined pin in the first row and the centertap of the fourth transformer is electrically connected to a predetermined pin in the second row. A circuit member having an enhanced layout upon which such connector may be mounted may also be provided.

An electrical connector may include a dielectric housing with a mating face and a module receiving face. The mating face includes a plurality of openings with each opening being configured to receive a mateable connector in a mating direction. The module receiving face is configured for receiving a plurality of filtering modules. Each filtering module has a housing and a magnetics assembly. The magnetics assembly includes transformer cores that have a plurality of wires wrapped therearound to define a transformer. Two of the plurality of wires of each transformer define first and second signal conductors and two of the plurality of wires are electrically connected and define a centertap of the transformer. The housing includes a first set of conductive pins extending from a surface of the housing and arranged in a linear array and that define a repeating pattern of first, second and third pins. The first signal conductor from each transformer is connected to one of the first conductive pins, the second signal conductor from each transformer is connected to one of the second conductive pins and the centertap from each transformer is connected to one of the third conductive pins.

An electrical connector may include a dielectric housing with a mating face and a module receiving face. The mating face includes a plurality of openings with each opening being configured to receive a mateable connector in a mating direction. The module receiving face is configured for receiving a plurality of filtering modules. Each filtering module has a housing, a magnetics assembly, a plurality of electrically conductive contacts and a module circuit board. The magnetics assembly includes at least one transformer core with a plurality of wires wrapped therearound to define a transformer. Some of the wires are electrically connected to the electrically conductive contacts and a portion of each electrically conductive contact extends into one of the openings for engaging contacts of a mateable connector. The housing includes first and second sets of conductive pins with the first set of conductive pins being mechanically and electrically connected to the wires of the magnetics assembly and the second set of pins being configured for interconnection to a circuit board upon which the electrical connector may be mounted. The module circuit board includes circuitry components to electrically connect and modify signals passing between predetermined ones of the first pins and predetermined ones of the second pins.

BRIEF DESCRIPTION OF THE DRAWINGS

Various other objects, features and attendant advantages will become more fully appreciated as the same becomes better understood when considered in conjunction with the accompanying drawings in which like reference characters designate the same or similar parts throughout the several views, and in which.

DETAILED DESCRIPTION OF THE ILLUSTRATED EMBODIMENT

The following description is intended to convey the operation of exemplary embodiments to those skilled in the art. It will be appreciated that this description is intended to aid the reader, not to limit the invention. As such, references to a feature or aspect are intended to describe a feature or aspect of an embodiment, not to imply that every embodiment must have the described characteristic. Furthermore, it should be noted that the depicted detailed description illustrates a number of features. While certain features have been combined together to illustrate potential system designs, those features may also be used in other combinations not expressly disclosed. Thus, the depicted combinations are not intended to be limiting unless otherwise noted.

Figure 1:
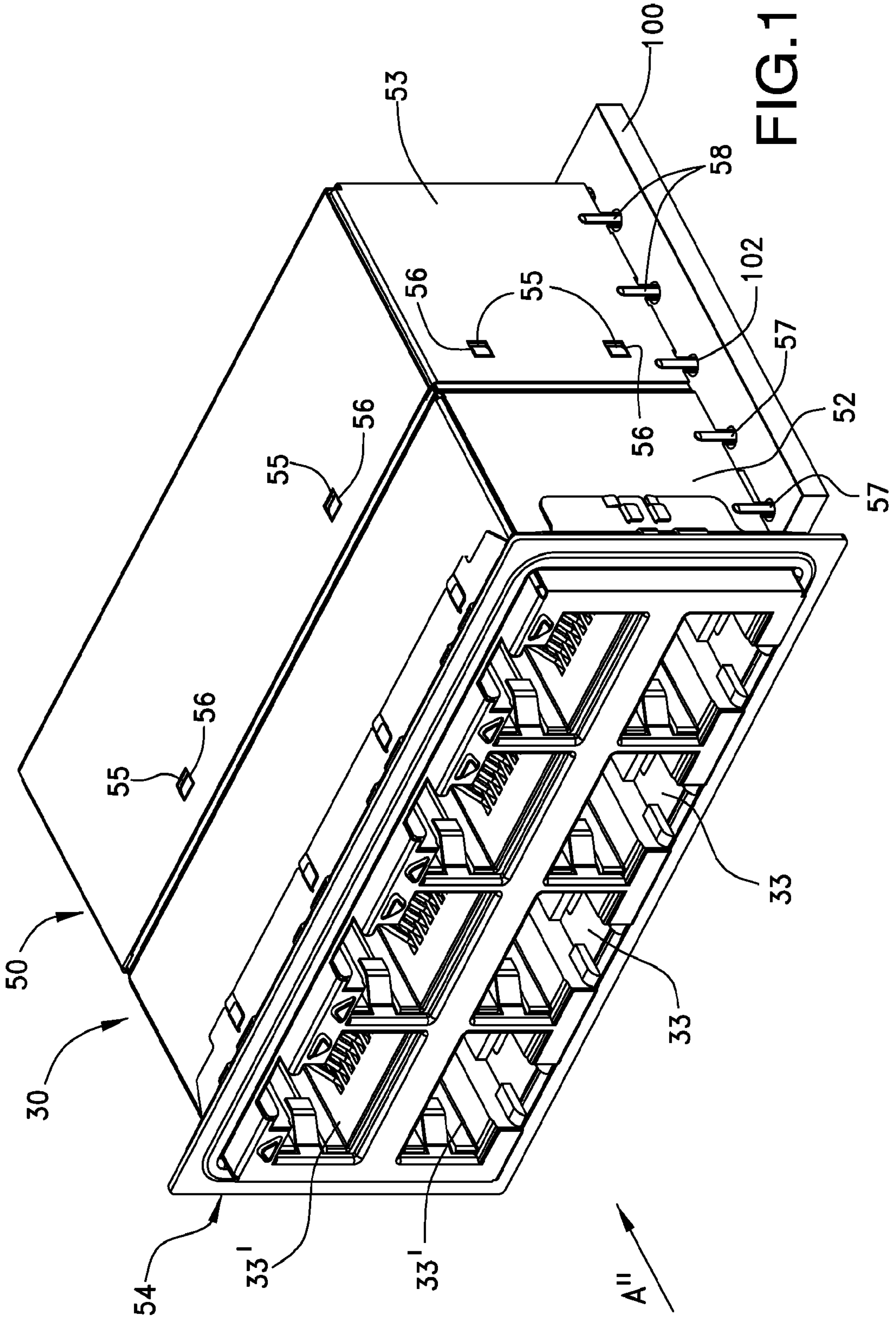
FIG. 1 is a front perspective view of a multiport magnetic jack assembly.

FIG. 1 illustrates the front side of a multiple input, magnetic, stacked jack 30 having a housing 32 made of an insulating material such as a synthetic resin (for example, PBT) and includes front side openings or ports 33 arranged in vertically aligned pairs 33' with each port configured to receive an Ethernet or RJ-45 type jack (not shown). Each port 33 has eight terminals and, according to the Ethernet standard, the terminals are coupled as differential pairs with the first and second terminals forming a first pair, the third and sixth terminals forming another pair, the fourth and fifth terminals forming still another pair and the seventh and eighth terminals forming the final pair. The magnetic jack 30 is configured to be mounted on circuit board 100. A metal or other conductive shield assembly 50 surrounds the magnetic jack housing 32 for RF and EMI shielding purposes as well as for providing a ground reference.

It should be noted that in this description, representations of directions such as up, down, left, right, front, rear, and the like, used for explaining the structure and movement of each part of the disclosed embodiment are not intended to be absolute, but rather are relative. These representations are appropriate when each part of the disclosed embodiment is in the position shown in the figures. If the position or frame of reference of the disclosed embodiment changes, however, these representations are to be changed according to the change in the position or frame of reference of the disclosed embodiment.

Shield assembly 50 fully encloses housing 32 except for openings aligned with ports 33 and the bottom or lower surface of the housing and includes a front shield component 52 and a rear shield component 53. Additional shielding components 54 are positioned adjacent and generally surround ports 33 to complete shield assembly 50. The joinable front and rear shield components are formed with interlocking tabs 55 and openings 56 for engaging and securing the components together when the shield assembly 50 is placed into position around the magnetic jack housing 32. Each of the shield components 52, 53 includes ground pegs 57, 58, respectively, that extend into ground through-holes 102 in the circuit board 100 when mounted thereon.

Figure 2:
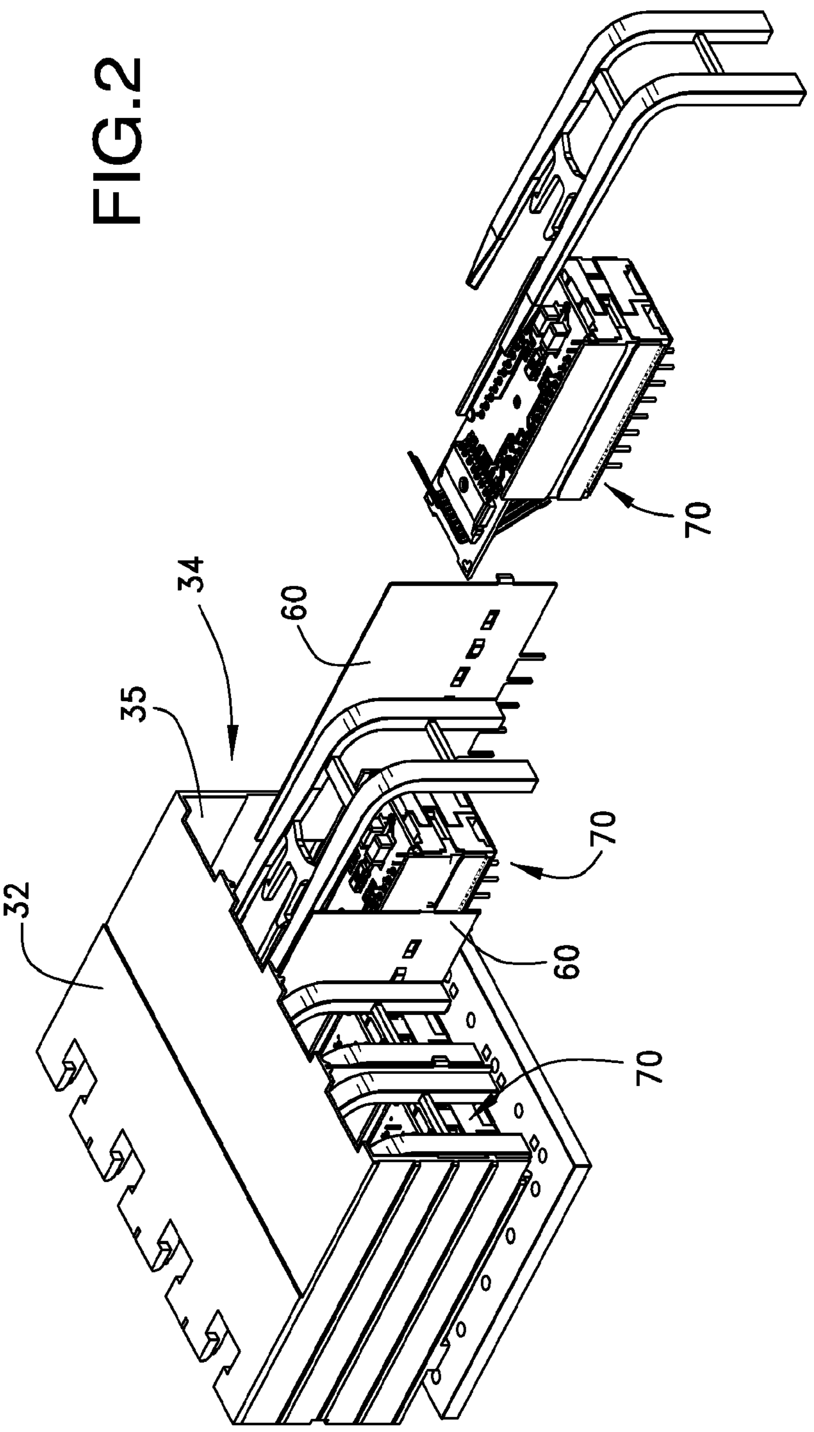
FIG. 2 is a partially exploded rear perspective view of the magnetic jack assembly of FIG. 1 with the internal subassembly modules and inter-module shields in various stages of insertion within the housing and with the outer shielding removed for clarity.
Figure 3:
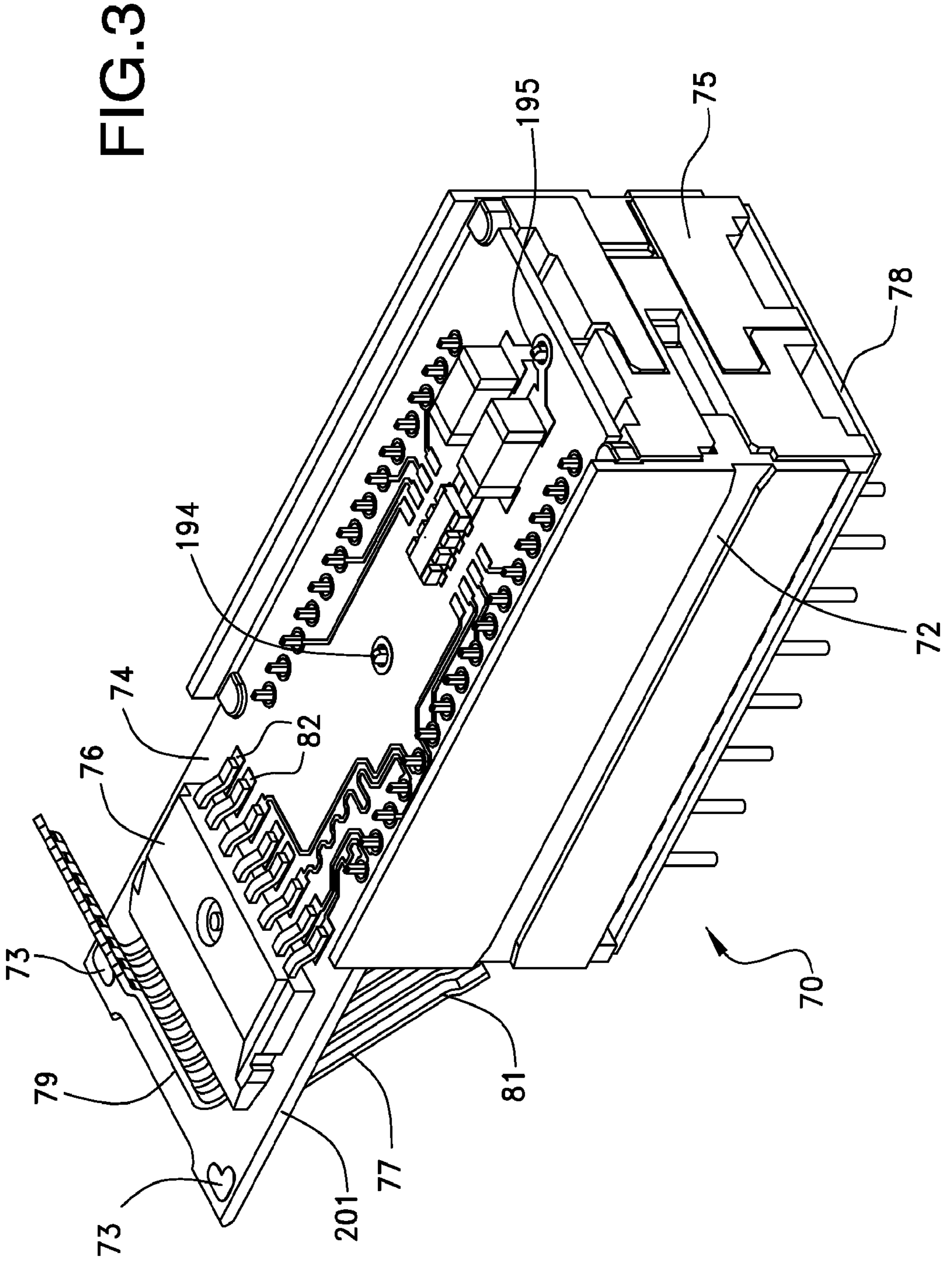
FIG. 3 is a perspective view of one of the internal subassembly modules of FIG. 2.

As depicted in FIG. 2, the rear portion of the magnetic jack housing 32 includes a large opening or receptacle 34 with three evenly spaced metal inter-module shields 60 positioned therein to define four subassembly receiving cavities 35. Each cavity 35 is sized and shaped to receive an internal subassembly module 70. While three inter-module shields 60 are depicted, a different number of shields may be used to define a different number of cavities. More specifically, to provide vertical electrical isolation or shielding between each module 70, one shield fewer in number than the desired number of modules is utilized. Shield 60 as depicted is stamped and formed of sheet metal material but could be formed of other conductive materials such as die cast metal or plated plastic material.

Referring to FIGS. 3-8, each internal subassembly module 70 includes a component housing 75 with transformer circuitry and filtering components therein. An upper circuit board 74 is mounted generally adjacent an upper surface of component housing 75 and includes upper and lower contact assemblies 76, 77 mechanically and electrically connected thereto. Lower circuit board 78 is mounted generally adjacent a lower surface of component housing 75. The upper circuit board 74 includes resistors, capacitors and other components associated with the transformers and chokes located inside the component housing 75.

Subassembly module 70 includes the upper contact assembly 76 and lower contact assembly 77 for providing a stacked jack, or dual jack, functionality. The upper contact assembly 76 is mounted to an upper surface of upper circuit board 74 and provides physical and electrical interfaces, including upwardly extending contact terminals 79, for connecting to an Ethernet plug inserted within port 33 in the upper row of ports. The lower contact assembly 77 is mounted to a lower surface of upper circuit board 74 and includes downwardly extending electrically conductive contact terminals 81 for connection to an Ethernet plug inserted within a port 33 in the lower row of ports. Upper contact assembly 76 is electrically connected to the upper circuit board 74 through leads which are soldered, or electrically connected by some other means such as welding or conductive adhesive, to a row of circuit board pads 82 that are positioned along the top surface of upper circuit board 74 generally adjacent a forward edge of component housing 75. Lower contact assembly 77 is similarly mounted on a lower surface of upper circuit board 74 and is connected to second, similar row of circuit board pads 83 on a lower surface of upper circuit board 74.

Figure 4:
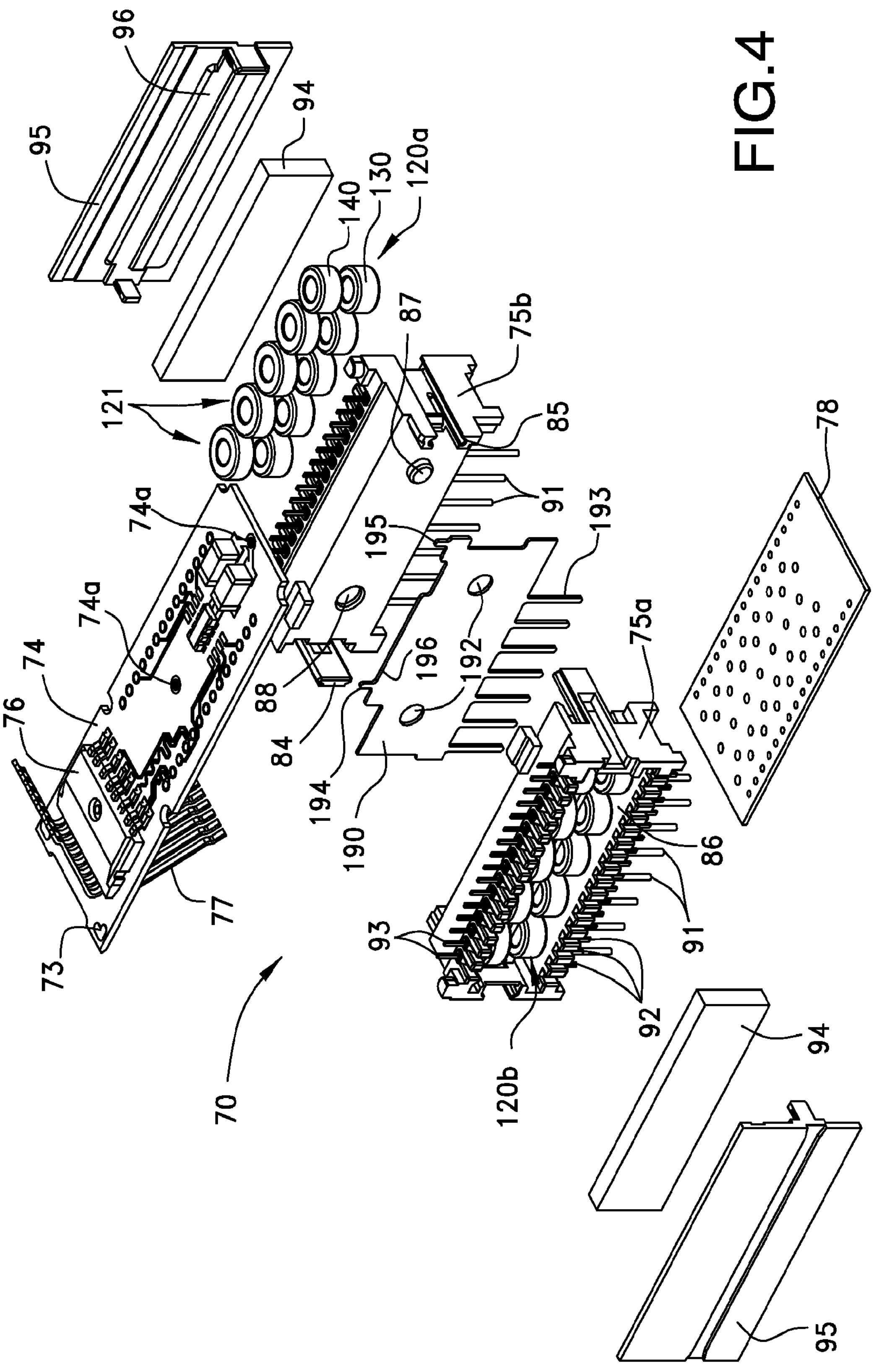
FIG. 4 is an exploded perspective view of the internal module of FIG. 3 with the windings removed for clarity.

Referring to FIG. 4, component housing 75 is a two-piece assembly having a left housing half 75*a* and right housing half 75*b*, one for holding the magnetics 120*a* of the upper port and the other for holding the magnetics 120*b* of the lower port of each pair of vertically aligned ports. The left and right housings halves 75*a*, 75*b* are formed from a synthetic resin such as LCP or another similar material and may be physically identical for reducing manufacturing costs and simplifying assembly. A latch projection 84 extends from the left sidewall (as viewed in FIG. 4) of each housing half. A latch recess 85 is located in the right sidewall of each housing half and lockingly receives latch projection 84 therein.

Each housing half 75*a*, 75*b* is formed with a large box-like receptacle or opening 86 that receives the filtering magnetics 120 therein. The receptacles 86 of the two housing halves 75*a*, 75*b* face in opposite directions and have an internal elongated shield member 190 positioned between the housing halves to electrically isolate the two receptacles. The surface of each housing half facing the elongated shield member 190 includes a projection 87 and a similarly sized socket 88 positioned such that when the two housing halves 75*a*, 75*b* are assembled together, the projection of each housing half will be inserted into the socket of the other housing half. The elongated shield member 190 includes a pair of holes 192 aligned with the projections 87 and receptacles 88 such that upon assembling the housing halves 75*a*, 75*b* and shield member 190, each projection 87 will extend through one of the holes 192 and into its socket 88 in order to secure shield member 190 in position relative to the housing halves.

After the transformer and choke assemblies 121 have been inserted into the receptacles 86 and the wires soldered to pins 92, 93, a shock absorbing, insulative foam insert 94 is inserted into each receptacle 86 over the transformer and choke assemblies 121 to secure them in place. An insulative cover 95 is secured to each housing half 75*a*, 75*b* to enclose receptacle 86 and secure foam insert 94 therein and to provide insulation or shielding between pins 93 and an adjacent inter-module shield 60.

Figure 5:
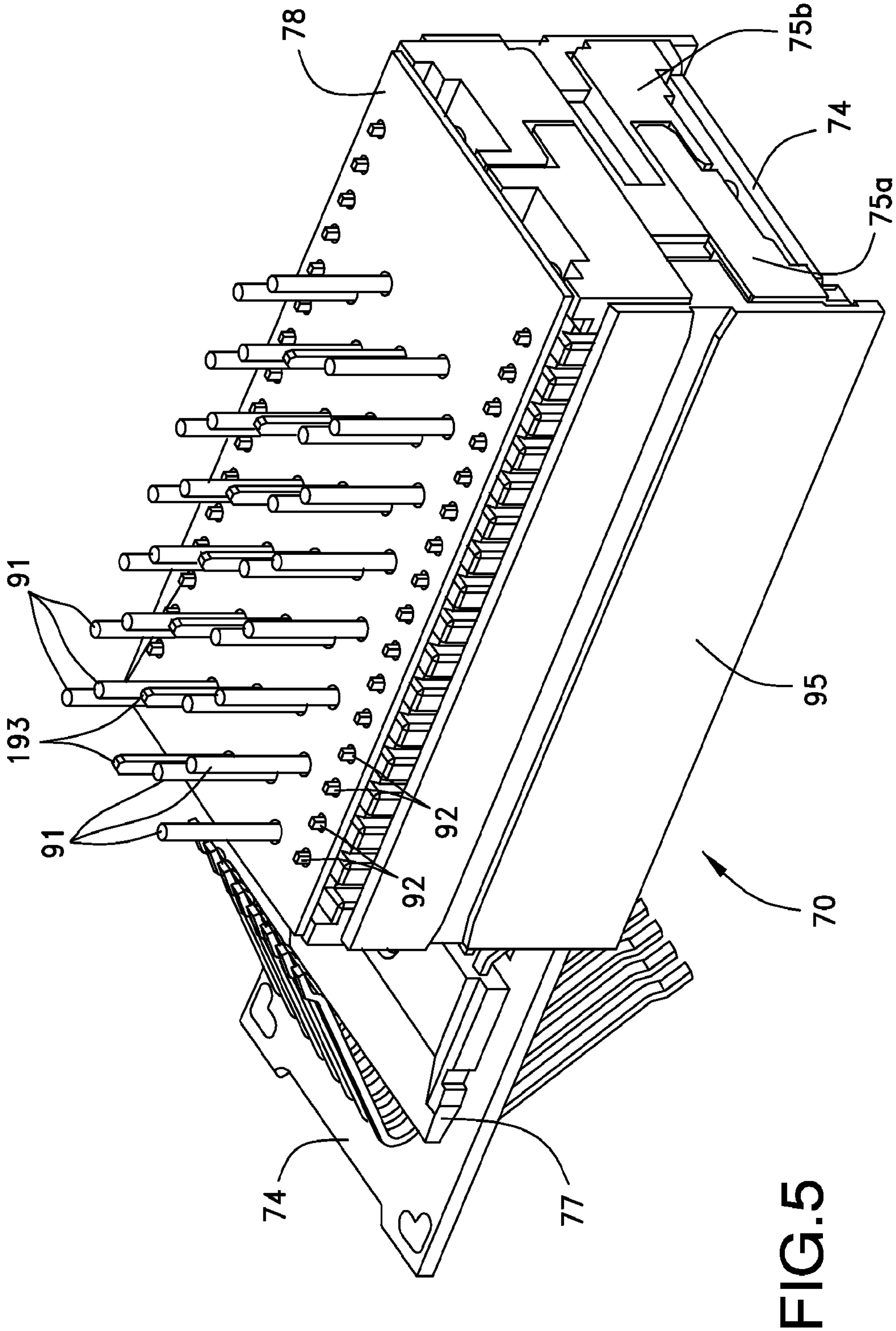
FIG. 5 is a perspective view of the bottom of the internal module of FIG. 3.
Figure 6:
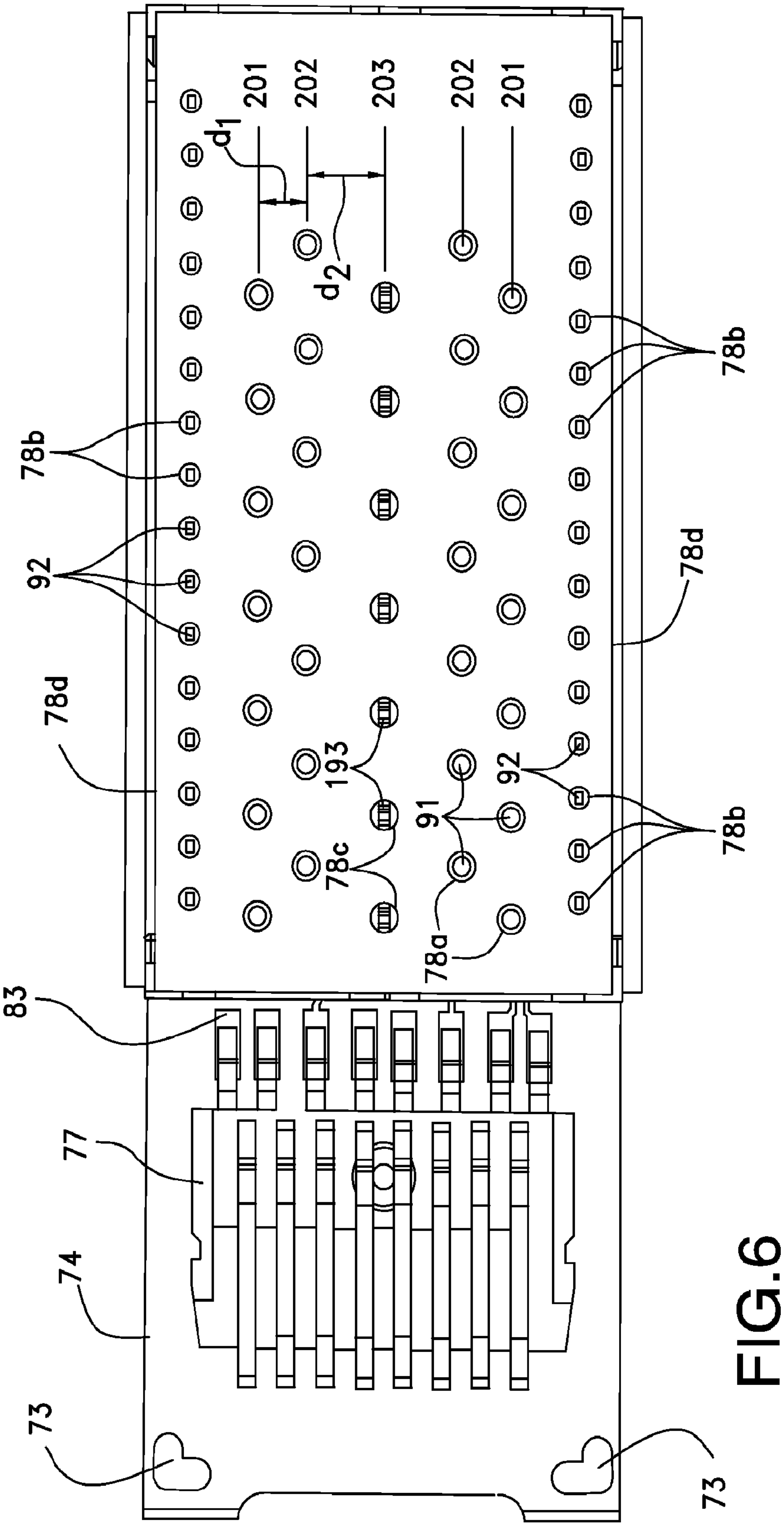
FIG. 6 is a bottom plan view of the internal module of FIG. 3.
Figure 7:
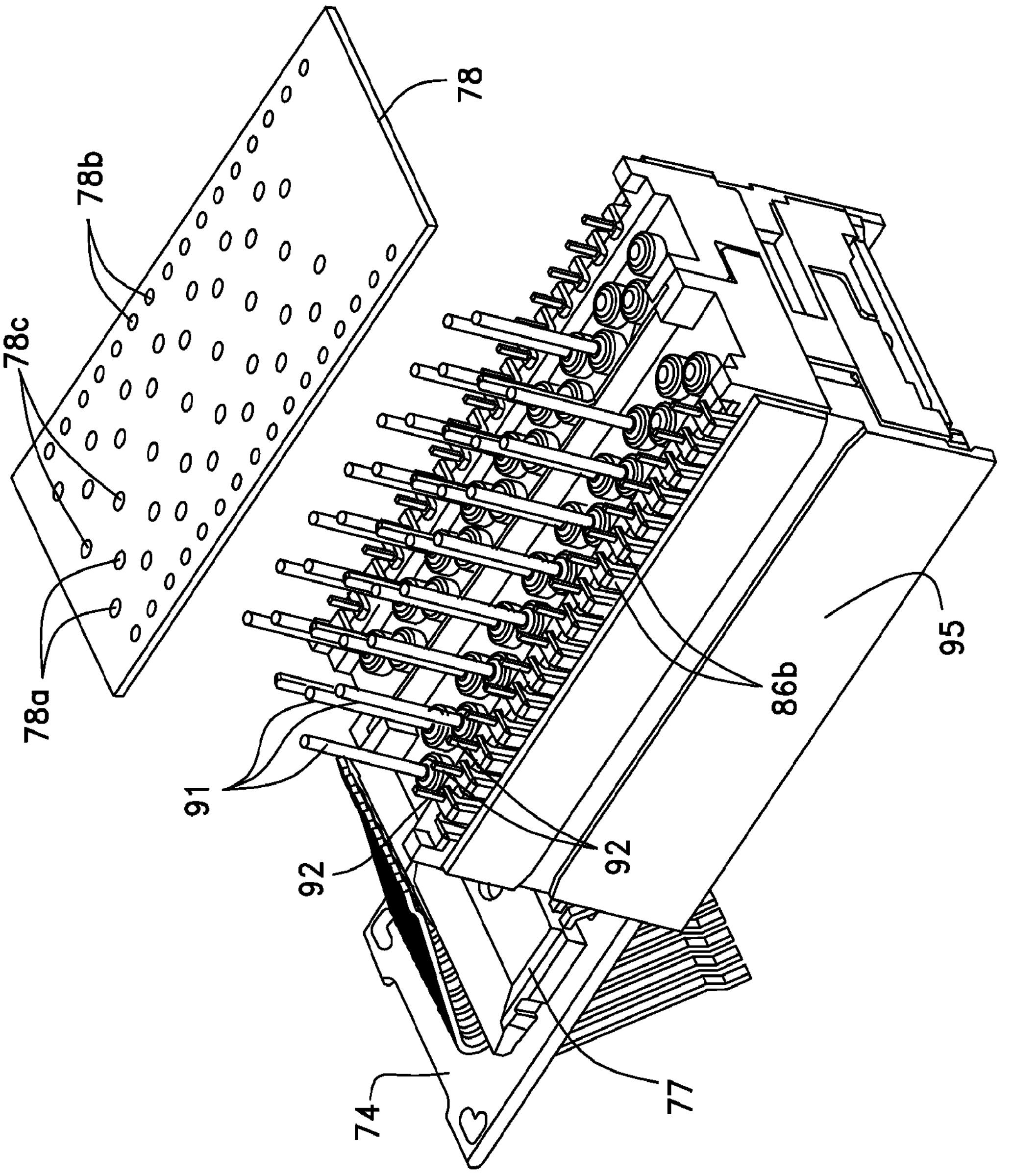
FIG. 7 is a perspective view similar to FIG. 5 but with the lower circuit board exploded from the module.

As best seen in FIGS. 5-7, a first set of electrically conductive pins or tails 91 extend out of the lower surface of each of the housing halves 75*a*, 75*b* and are configured to be inserted through holes 78*a* in the lower circuit board 78 and soldered thereto. Pins 91 are long enough to extend past lower circuit board 78 and are configured to be subsequently inserted into holes (not shown) in circuit board 100 and soldered thereto. A second, shorter linear set of electrically conductive pins 92 also extend out of the lower surface of each of the housing halves 75*a*, 75*b* and extend into and are subsequently soldered to holes 78*b* in lower circuit board 78. A third linear set of electrically conductive pins 93 (FIG. 8) extend out of the upper surface of each of the housing halves 75*a*, 75*b* and are inserted into holes 74*a* in upper circuit board 74 and soldered thereto.

The tails 91 that extend from each housing half 75*a*, 75*b* are positioned in two linear arrays or rows 201, 202 that are staggered relative to each other by one half the distance or pitch between adjacent tails. When combined, the two rows form a staggered array of tails 91 that can be seen as a series of triangular arrays of pins. Inasmuch as each housing half 75*a*, 75*b* includes a staggered array of tails, two sets of staggered tails 91 can be seen extending from the bottom of housing 75, one on each side of the tails 193 of shield member 190. The staggered tails extend through the holes 78*a* in lower circuit board 78 as best seen in FIGS. 5-6.

Figure 14:
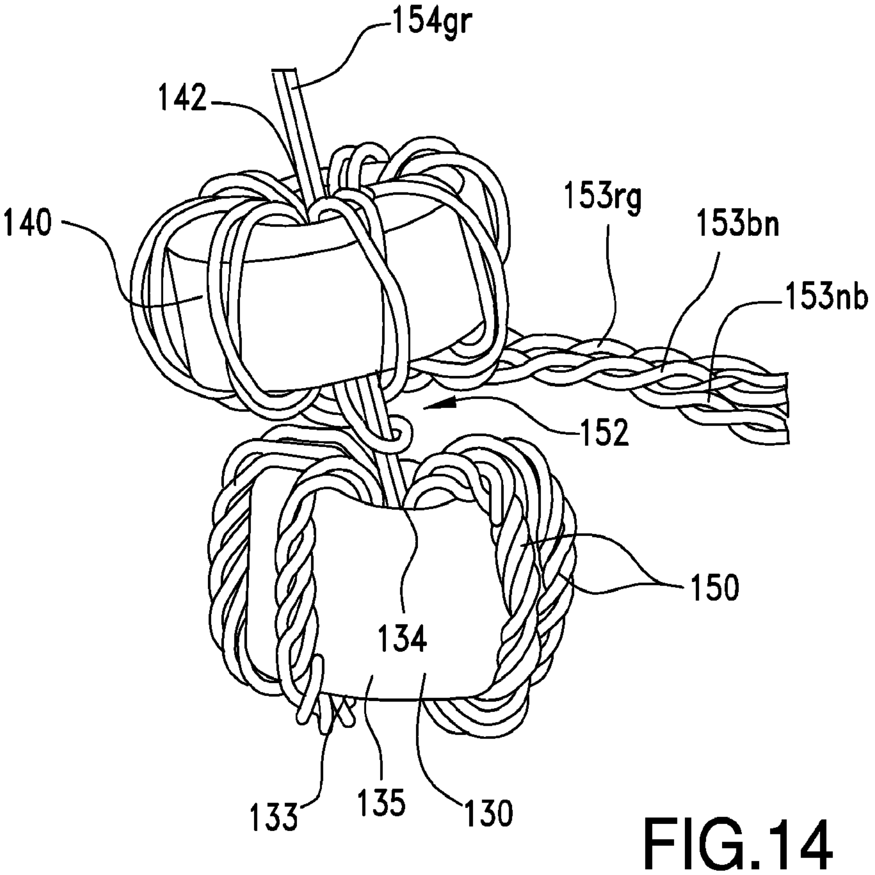
FIG. 14 is a side elevational view of a transformer and choke subassembly that may be used with the disclosed embodiment.

Housing halves 75*a*, 75*b* include a linear array of spaced apart wire alignment fingers 86*a*, 86*b* (FIG. 8) that extend outward adjacent the upper and lower edges of receptacle 86. Upper pins 93 are aligned with slots between each of the upper fingers 86*a* and arranged in a linear array and lower pins 92 are aligned with slots between the lower fingers 86*b* that extend from the housing. Wires from the magnetics 120 are fed between the fingers 86*a*, 86*b* and then wrapped around and soldered to their respective pins 92, 93. The number of pins 92, 93 in each row is equal to or exceeds three times the number of transformer and choke subassemblies 121 (FIG. 14). Each subassembly 121 includes two pairs of differential signal wires and two pairs of electrically connected wires that act as centertaps of the primary and secondary sides of the transformer which are connected to pins 92, 93 as described below.

The magnetics 120 provide impedance matching, signal shaping and conditioning, high voltage isolation and common-mode noise reduction. This is particularly beneficial in Ethernet systems that utilize cables having unshielded twisted pair ("UTP") transmission lines, as these line are more prone to picking up noise than shielded transmission lines. The magnetics help to filter out the noise and provide good signal integrity and electrical isolation. The magnetics include four transformer and choke subassemblies 121 associated with each port 33. The choke is configured to present high impedance to common-mode noise but low impedance for differential-mode signals. A choke is provided for each transmit and receive channel and each choke can be wired directly to the RJ-45 connector.

Elongated shield member 190 is a generally rectangular plate and includes seven downwardly depending solder tails 193 configured for insertion and soldering in holes 78*c* in lower circuit board 78. Tails 193 are long enough to extend past lower circuit board 78 and are subsequently inserted into holes (not shown) in circuit board 100 and soldered thereto. Two upwardly extending solder tails 194, 195 extend from a top surface or edge 196 of shield member 190 and are configured for insertion and soldering in through-holes 74*a* in upper circuit board 74. Shield member 190 is configured to shield the transformers 130 and chokes 140 as well as other circuit components of each housing half from those of its adjacent housing half in order to shield the circuitry of the lower port from that of its vertically aligned upper port.

As described above, the magnetics 120 associated with each port 33 of the connector include four transformer and choke subassemblies 121. Referring to FIG. 14, one embodiment of a transformer and choke subassembly 121 can be seen to include a magnetic ferrite transformer core 130, a magnetic ferrite choke core 140, transformer windings 160 and choke windings 170. Transformer core 130 is toroidal or donut-shaped and may include substantially flat top and bottom surfaces 132, 133, a central bore or opening 134 that defines a smooth, cylindrical inner surface and a smooth, cylindrical outer surface 135. The toroid is symmetrical about a central axis through its central bore 134. Choke 140 may be similarly shaped. Other forms of magnetic and filtering assemblies could be used if desired.

Figure 13:
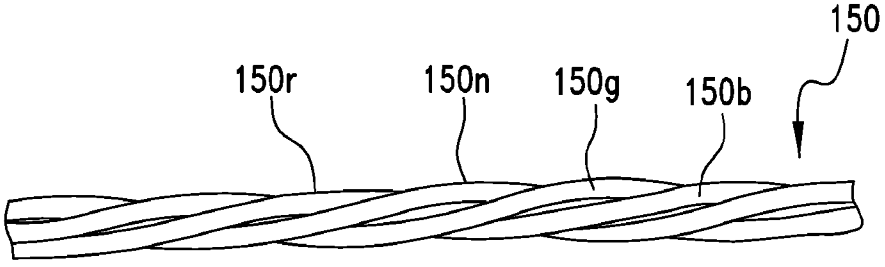
FIG. 13 is a side elevational view of twisted wires that may be used with the transformer and noise reduction components of the disclosed embodiment.

FIG. 13 illustrates a group of four wires 150 that are initially twisted together and wrapped around the transformer toroid 130. Each of the four wires is covered with a thin, color-coded insulator to aid the assembly process. As depicted herein, the four wires 150 are twisted together in a repeating pattern of a red wire 150*r*, a natural or copper-colored wire 150*n*, a green wire 150*g*, and a blue wire 150*b*. The number of twists per unit length, the diameter of the individual wires, the thickness of the insulation as well as the size and magnetic qualities of the toroids 130 and 140, the number of times the wires are wrapped around the toroids and the dielectric constant of the material surrounding the magnetics are all design factors utilized in order to establish the desired electrical performance of the system magnetics.

As shown in FIG. 14, the four twisted wires 150 are inserted into central bore or opening 134 of toroid 130 and are wrapped around the outer surface 135 of the toroid. The twisted wires 150 are re-threaded through central bore 134 and this process is repeated until the twisted wire group 150 has been threaded through the central bore a predetermined number of times. The ends of the twisted wires adjacent the lower surface 133 of the toroid 130 are bent upward along the outer surface 135 of toroid 130 and wrapped around the other end of the twisted wires to create a single twist 152 that includes all of the wires of the second end wrapped around all of the wires of the first end. The individual wires from the first and second ends are untwisted immediately beyond (or above as viewed in FIG. 13) the single twist 152. One wire from a first end of the group of twisted wires is twisted with a wire from the other end of the group of wires to create twisted wire sections 153*rg*, 153*bn*, 153*nb*. A choke twisted wire section 154*gr* is slid into central opening 142 of choke toroid 140 and looped around the choke toroid the desired number of times. The end of twisted wire section 153*bn* is separated to re-establish individual wires 150*b*, 150*n* and the end of choke twisted wire section 154*gr* is separated to re-establish individual wires 150*g*, 150*r*. The insulation on the ends of the remaining twisted wire sections 153*rg*, 153*nb* is removed to create centertaps from the primary and secondary sides of the transformer.

Figure 8:
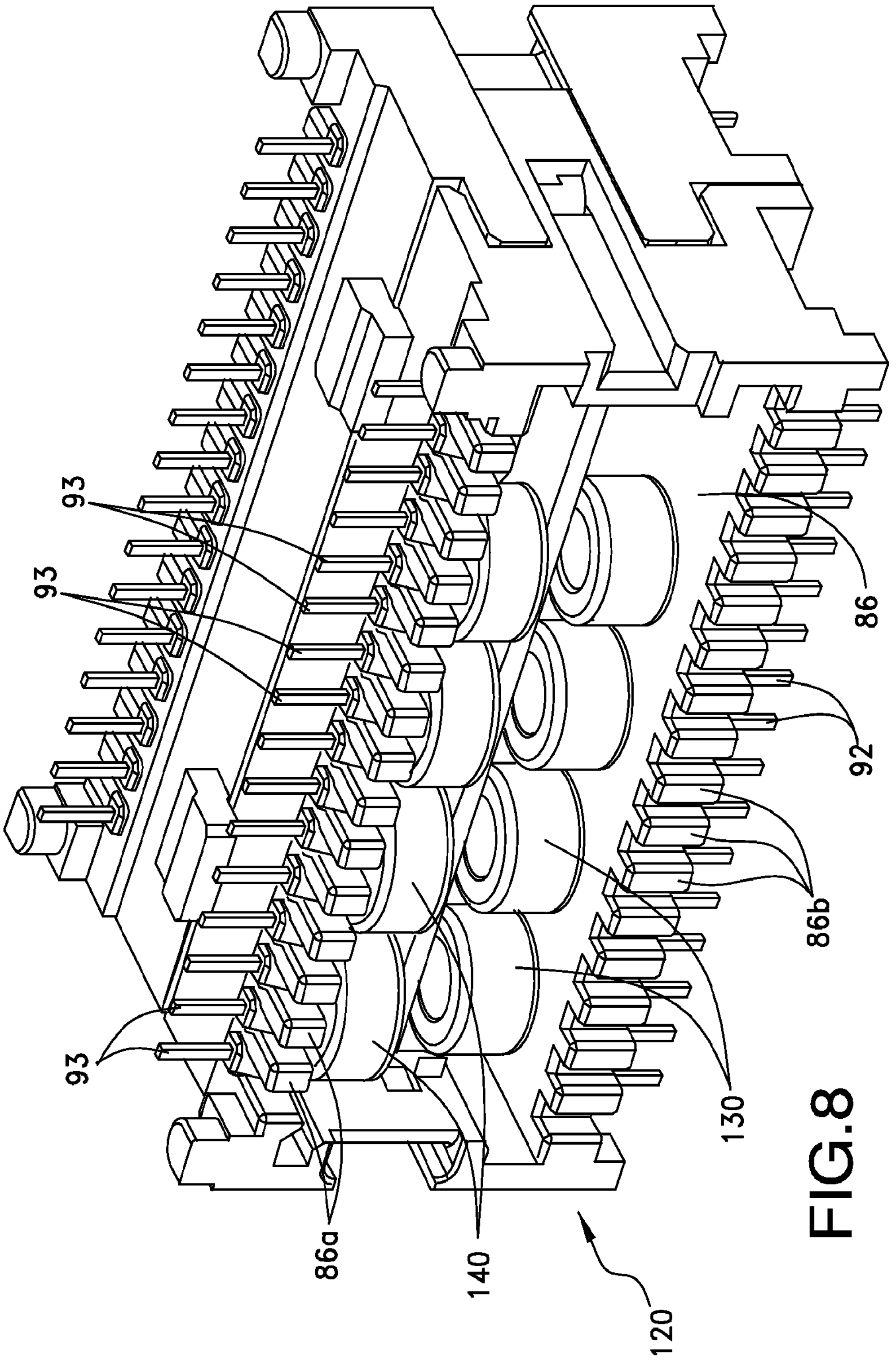
FIG. 8 is a perspective view of components of the housing assembly of the internal module with the windings of the transformer and choke subassemblies removed and only certain pins mounted on the housing for clarity.
Figure 9:
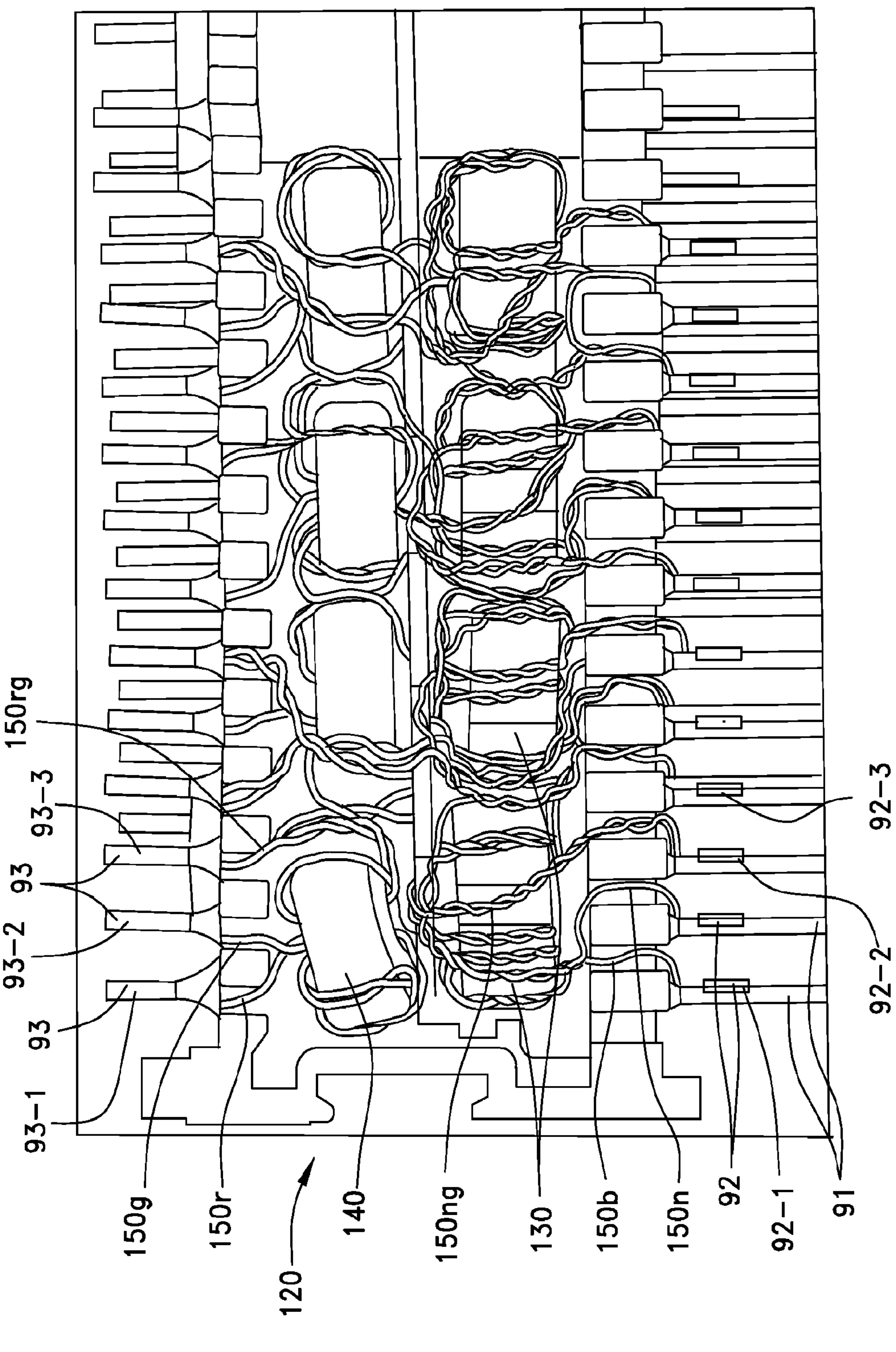
FIG. 9 is a side view of the housing assembly of FIG. 8 but with the windings depicted.

As depicted in FIGS. 8 and 9, four transformer and choke assemblies 121 are inserted into each receptacle 86 and the wires are then soldered or otherwise connected to pins 92, 93. More specifically, the transformer and choke assemblies 121 are inserted into receptacle 86 with choke 140 positioned above transformer core 130. The red wire 150*r* extending out of choke 140 is inserted into the slot between upper alignment fingers 86*a* and twisted around the first upper pin 93-1 (FIG. 9) and soldered thereto. The green wire 150*g* extending out of choke 140 is inserted into the next slot between upper alignment fingers 86*a* and twisted around the second upper pin 93-2 and soldered thereto. The red and green wires that have been twisted together and electrically connected as centertap 153*rg* are inserted into the next slot between upper alignment fingers 86*a* and then twisted around the third upper pin 93-3 and soldered thereto. The blue wire 150*b* extending from the transformer and choke subassembly 121 is inserted into the slot between lower alignment fingers 86*b* and wrapped around the first lower pin 92-1 and soldered thereto. The natural wire 150*n* is inserted into the next slot between lower alignment fingers 86*b* and wrapped around the second lower pin 92-2 and soldered thereto. The pair of natural and blue wires that have been twisted together and electrically connected to create centertap 153*nb* are inserted into the next slot between lower alignment fingers 86*b* and twisted around the third lower pin 92-3 and soldered thereto. This process is repeated for each transformer and choke assembly 121 that is inserted into receptacle 86 in each housing half 75*a*, 75*b*. As a result, each of the wires 150*r*, 150*n*, 150*g*, 150*b* is connected to a pin 92, 93 adjacent their respective transformer and choke subassembly 121. Each of the centertaps 153*nb*, 153*rg* is connected to an individual pin 92-3, 93-3 that is located between the signal pins connected to an adjacent transformer and choke subassembly. This pattern of interconnecting transformer and choke subassemblies 121 to the lower and upper pins 92, 93 is repeated with respect to the remaining subassemblies 121 and pins 92, 93.

It should be noted that transformer and choke subassemblies depicted in FIG. 9 utilize a somewhat different winding scheme than that depicted in FIG. 14 and described above. In addition, the subassemblies depicted in FIG. 9 replace the individual wires of FIG. 14 with two separate wires that are twisted together.

Lower circuit board 78 includes a linear array 203 of plated-through holes 78*c* along its longitudinal axis "L" (FIG. 10) for receiving therein the downwardly depending solder tails 193 that extend from elongated shield member 190. Through-holes 78*c* are electrically connected to a reference or ground plane within circuit board 78. Through-holes 78*a* are positioned in two offset rows 201, 202 (FIG. 6) on opposite sides of the linear array 203 of through-holes 78*c* of circuit board 78. The through-holes 78*a* are at least equal in number to and aligned with tails 91 that extend from the bottom of housing halves 75*a*, 75*b*. Once positioned in the through-holes 78*a*, the tails 91 may be soldered thereto. A linear array of through-holes 78*b* is provided generally along each longitudinal side 78*d* of lower circuit board 78 and are at least equal in number to the number of pins 92 that extend from the lower surface of housing halves 75*a*, 75*b*. Such pins 92 extend into holes 78*b* and may be soldered therein to connect the pins (and thus the transformer and choke subassemblies 121) to lower circuit board 78. The distance $d_1$ between the outer and inner rows of through holes 78*a* is less than the distance $d_2$ between the inner row 202 of through holes and the linear array 203 of through holes 78*c*.

Figure 10:
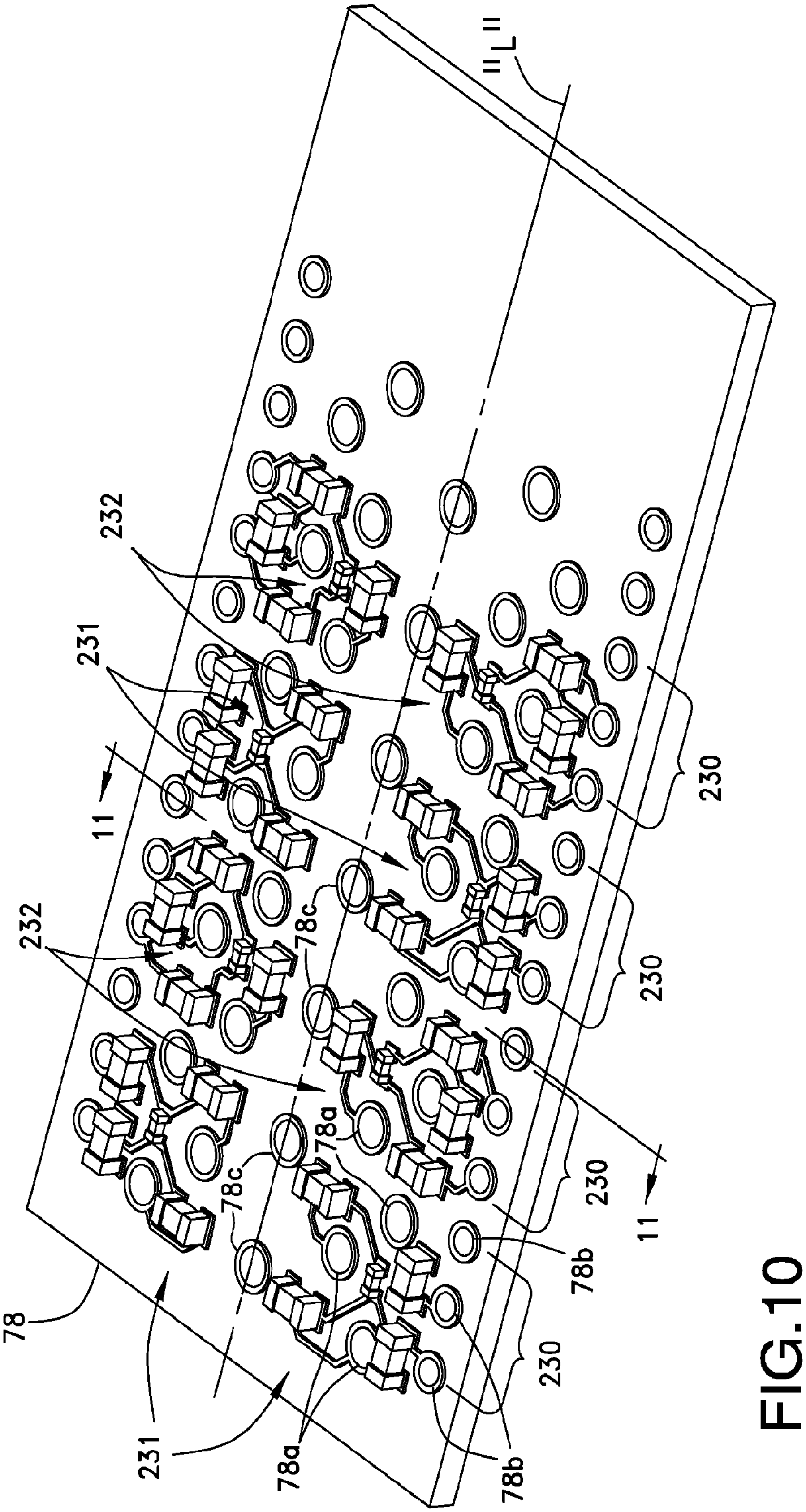
FIG. 10 is a perspective view of the lower circuit board of the internal module.
Figure 11:
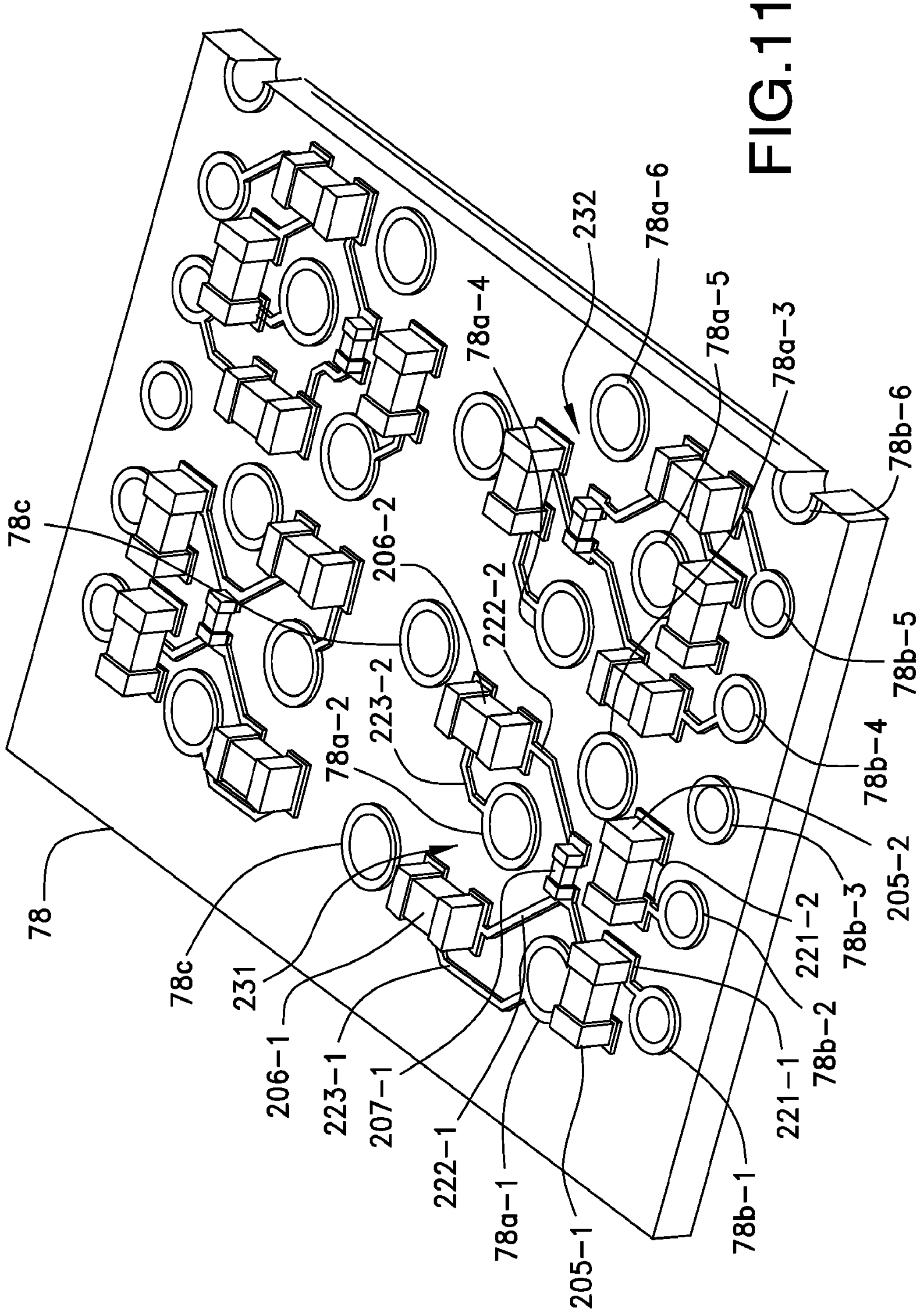
FIG. 11 is a fragmented perspective view of the lower circuit board taken generally along line 11-11 of FIG. 10.

Referring to FIGS. 10 and 11, lower circuit board 78 includes a plurality of circuits 204 including inductors 205, 206 and capacitors 207 that are positioned between and connected to holes 78*a* and holes 78*b*. It can be seen that linear groups 230 of three through-holes 78*b* are connected to triangular groups 231, 232 of three through-holes 78*a*. As depicted, the first three linear through-holes 78*b*-1, 78*b*-2 and 78*b*-3 are connected to the triangular group 231 of three through-holes 78*a*-1, 78*a*-2 and 78*a*-3. More specifically, through-hole 78*b*-1 (for connection to one of the signal wires from a first transformer and choke subassembly 121) is connected to a first inductor 205-1 associated with that through hole by trace 221-1. The opposite end of the first inductor 205-1 is connected to one side of capacitor 207-1 and to a second inductor 206-1 by trace 222-1. The opposite end of the second inductor 206-1 is connected to through-hole 78*a*-1 by trace 223-1. Through-hole 78*b*-2 (which is also connected to one of the signal wires from the first transformer and choke subassembly 121) is connected to a first inductor 205-2 associated with through hole 78*b*-2 by trace 221-2. The opposite end of the first inductor 205-2 is connected to the opposite side of capacitor 207-1 and to a second inductor 206-2 by trace 222-2. The opposite end of the second inductor 206-2 is connected to through-hole 78*a*-2 by trace 223-2. Through hole 78*b*-3 (which is connected to the centertap of the first transformer and choke subassembly 121) is connected directly to through-hole 78*a*-3 by a conductive trace (not shown) that extends through circuit board 78.

The second group of three linear through-holes 78*b*-4, 78*b*-5 and 78*b*-6 is connected to the inverted triangular group 232 of three through-holes 78*a*-4, 78*a*-5 and 78*a*-6. Since the triangular group 232 is inverted as compared to triangular group 231, in order to maintain substantially similar functionality, the circuitry used to connect to the inverted triangular group 232 of through-holes 78*a* is similar but not identical to the circuitry used to connect group 230 to group 231. Once tails 91 and pins 92 are soldered to board 78, tails 91 are electrically connected to pins 92 by the circuitry that includes the circuit traces, inductors and capacitors. The inductors and capacitors are sized and configured so as to provide filtering of the signals as they pass between tails 91 and pins 92. If desired, other functionality could be included on circuit board 78 to provide additional or other modifications to signals passing between tails 91 and pins 92.

It should be noted that through holes 78*b* are configured in a repeating array of a first signal $S_1$ from a transformer and choke subassembly 121, a second signal $S_2$ from the same transformer and choke subassembly and a centertap CT from the same transformer and choke subassembly. This pattern repeats along the length of both rows of through holes 78*b*.

Through holes 78*a* are interconnected to through holes 78*b* through circuitry of circuit board 78 but the position of first signal $S_1$, the second signal $S_2$ and the centertap CT of each transformer and choke subassembly 121 alternates for each adjacent transformer and choke subassembly. More specifically, a first signal $S_1$ from a first transformer and choke subassembly is connected to through hole 78*b*-1 and travels through board 78 to through hole 78*a*-1 in the outer row 201 of through holes 78*a*. A second signal $S_2$ from the same transformer and choke subassembly is connected to through hole 78*b*-2 and travels through board 78 to through hole 78*a*-2 in the inner row 202 of through holes 78*a*. A centertap CT from the same transformer and choke subassembly is connected to through hole 78*b*-3 and travels through board 78 to through hole 78*a*-3 in the outer row 201 of through holes 78*a*. A first signal $S_1$ from a second transformer and choke subassembly is connected to through hole 78*b*-4 and travels through board 78 to through hole 78*a*-4 in the inner row 202 of through holes 78*a*. A second signal $S_2$ from the same (second) transformer and choke subassembly is connected to through hole 78*b*-5 and travels through board 78 to through hole 78*a*-5 in the outer row 201 of through holes 78*a*. A centertap CT from the same (second) transformer and choke subassembly is connected to through hole 78*b*-6 and travels through board 78 to through hole 78*a*-6 in the inner row 201 of through holes 78*a*.

The disclosed configuration improves the electrical performance and isolation of the individual transformers by providing a separate pin 92, 93 connected to each centertap rather than having centertaps share pins. The isolation between signal pairs is improved by having the centertaps positioned between pins connected to the signal pairs which also reduces the amount that any of the wires (such as the centertaps) cross over the wires of other transformer and choke subassemblies 121. Finally, the use of tails 91 together with pins 92 and lower board 78 permits the addition of filtering and other signal modifications along the circuitry between tails 91 and pins 92.

Figure 12:
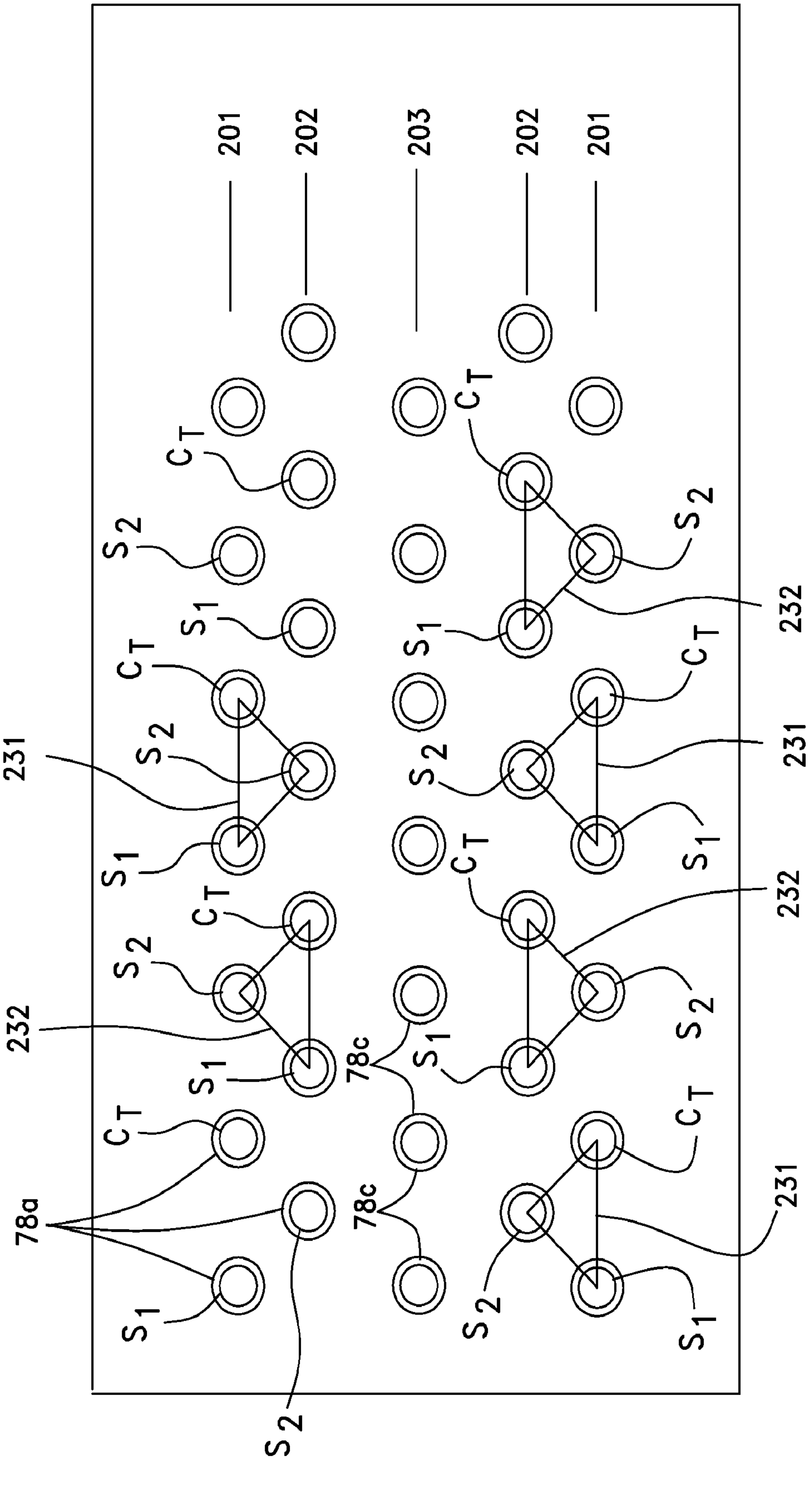
FIG. 12 is a diagrammatic view of the lower circuit board of the internal module with certain holes and pins removed for clarity.

Referring to FIG. 12, it can be seen that the signal conductors and centertaps are arranged in triangular arrays 231, 232 including two signal conductors $S_1$, $S_2$ that form a differential pair connected to a single transformer and choke subassembly 121 and the centertap CT extending from such transformer and choke subassembly. The triangular arrays are positioned so as to alternate with first triangles 231 that are oriented in a first direction and second triangles 232 that are inverted relative to the first direction. Thus, it can be seen that each triangular array includes two signal terminals $S_1$, $S_2$ and a centertap CT so that each centertap has a dedicated tail 91 for connection to circuit board 100. Each triangular array has a based formed of signal terminal $S_1$ and centertap CT and a peak corresponding to signal terminal $S_2$. Since the orientation of the triangular arrays alternate, the location of the peak also alternates from inner row 202 of through holes 78*a* to the outer row 201 of the through holes. In addition, it can be seen that signal terminals of adjacent transformer and choke subassemblies 121 are not positioned in close proximity but rather the closest tail to the signal tails of each subassembly is the centertap of the adjacent subassembly. This configuration can help increase the isolation of the individual transformer and choke subassemblies 121 and thus can help improve the performance of the jack 30.

The footprint of FIG. 12 depicts the location of some of the tails 91, 193 that extend from module board 78 as well as the footprint of part of circuit board 100 upon which jack 30 may be mounted. The actual footprint used on module board 78 and circuit board 100 would depend on the number of modules 70 associated with each module board 78 and circuit board 100. Through the configuration of tails 91, pins 92, 93 and the circuitry of circuit board 78, simplified manufacturing and improved performance can be provided. Even if a staggered array of tails 91 is desired, the depicted embodiment can utilize linear arrays of pins to simplify wrapping or termination of the wires from the transformer and choke subassemblies 121 and permit improved isolation by avoiding extending the wires a significant distance and crossing over wires from adjacent subassemblies.

Figure 15:
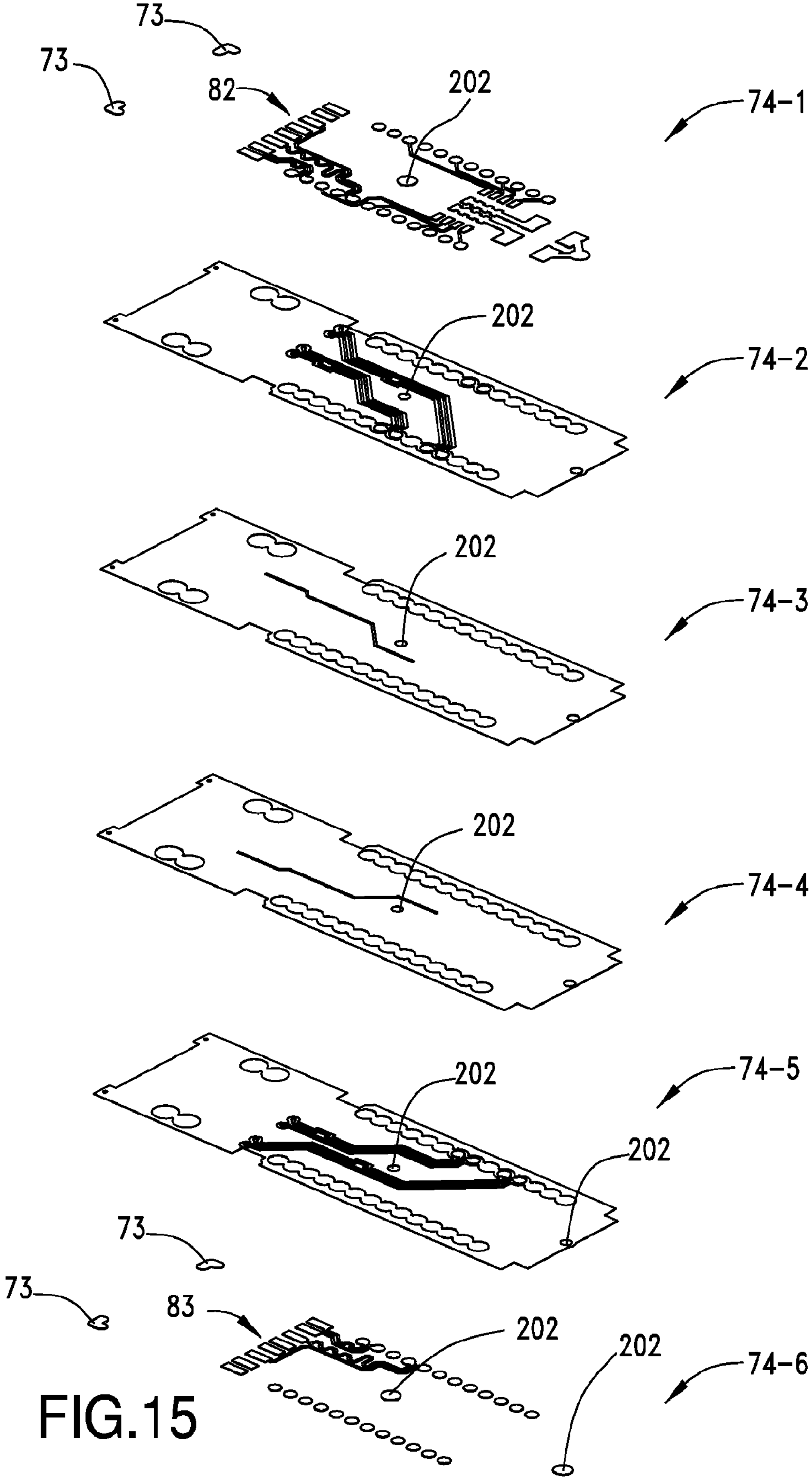
FIG. 15 is an exploded perspective view of the conductive layers of the upper circuit board of the internal module.

Referring to FIG. 15, upper circuit board 74 includes six conductive layers 74-1, 74-2, 74-3, 74-4, 74-5, 74-6. Each of the conductive layers is separated from an adjacent conductive layer by a layer of a dielectric or insulative material such that the circuit board is generally formed of a dielectric material 201 with the conductive layers in or on the dielectric material. Conductive layers 74-1 and 74-6 include primarily signal conductors, conductive layers 74-3 and 74-4 include only reference or ground conductors and conductive layers 74-2 and 74-5 include both signal and reference conductors. Once assembled, the reference conductors are inter-connected by plated through-holes or vias 202. A top layer 74-1 includes various signal circuits together with a plurality of circuit board pads 82 that are connected to leads of upper contact assembly 76 by soldering or some other means such as welding or conductive adhesive. Lower conductive layer 74-6 also includes conductive circuitry and a row of circuit board pads 83 to which lower contact assembly 77 is soldered or electrically connected by some other means such as welding or conductive adhesive.

Upper and lower conductive layers 74-1 and 74-6 include L-shaped conductive ground pads 73 generally adjacent the forward end 204 of upper circuit board 74. Conductive ground pads 73 are inter-connected to the ground reference circuitry of conductive layers 74-2, 74-3, 74-4 and 74-5 by conductive vias. The various conductive layers of circuit board 74 provide identical functionality to upper contact assembly 76 and lower contact assembly 77 so that the electrical performance of the upper and lower ports of modular jack 30 are identical.

Although the disclosure provided has been described in terms of an illustrated embodiment, it is to be understood that the disclosure is not to be interpreted as limiting. Various alterations and modifications will no doubt become apparent to those skilled in the art after having read the above disclosure. For example, the modular jack is depicted as a right angle connector but may also have a vertical orientation. Accordingly, numerous other embodiments, modifications and variations within the scope and spirit of the appended claims will occur to persons of ordinary skill in the art from a review of this disclosure.

The invention claimed is:

1. A multi-layer circuit member comprising:

a conductive reference plane;

a linear array of reference through holes interconnected to the reference plane; and first and second arrays of through holes positioned on opposite sides of the linear array, each of the first and second arrays of through holes including first and second rows of through holes, the first and second rows being offset in a direction so that each of the rows is generally parallel to the linear array of reference through holes, wherein the through holes of each of the first and second arrays are arranged in a series of first, second, third and fourth triangular arrays of through holes, the triangular arrays being arranged in an alternating manner with the second and fourth triangular arrays being inverted relative to the first and third triangular arrays.

2. The multi-layer circuit member of claim 1, wherein the first and second arrays of through holes are mirror-images of each other.

3. The multi-layer circuit member of claim 1, wherein each triangular array includes a differential pair of signal conductors and a centertap conductor.

4. The multi-layer circuit member of claim 1, wherein the triangular arrays of through holes include a base defined by first and second through holes and a peak defined by a third through hole, the peak of each triangular array having generally identical electrical functionality.

5. The multi-layer circuit member of claim 4, wherein the first and second arrays of through holes are mirror-images of each other.

6. The multi-layer circuit member of claim 4, wherein a first distance from the peak of the first and third triangular arrays to the linear array of reference through holes is less than a second distance from the base of the first and third triangular arrays to the linear array of reference through holes and a third distance from the peak of the second and fourth triangular arrays to the linear array of reference through holes is greater than a fourth distance from the base of the second and fourth triangular arrays to the linear array of reference through holes.

7. A multi-layer circuit member comprising:

a conductive reference plane;

a linear array of reference through holes interconnected to the reference plane;

first and second arrays of through holes positioned on opposite sides of the linear array, each of the first and second arrays of through holes including first and second rows of through holes, the first and second rows being offset from each other in a direction so that each of the rows is generally parallel to the linear array of reference through holes; and first and second additional linear arrays of through holes, the first array of through holes being positioned between the first additional linear array and the linear array of reference through holes and the second array of through holes being positioned between the second additional linear array and the linear array of reference through holes.

8. The multi-layer circuit member of claim 7, further including circuitry to electrically connect each of the through holes of the first additional linear array to one of the through holes of the first array of through holes and electrically connect each of the through holes of the second additional linear array to one of the through holes of the second array of through holes.

9. A filtering module, comprising:

the multi-layer circuit board that includes a conductive reference plane, a linear array of reference through holes interconnected to the reference plane and first and second arrays of through holes positioned on opposite sides of the linear array, each of the first and second arrays of through holes including first and second rows of through holes, the first and second rows being offset in a direction so that each of the rows is generally parallel to the linear array of reference through holes;

a dielectric housing, wherein the multi-layer circuit board is mounted on the housing; and a magnetics assembly mounted on the housing including a plurality of filtering transformers, each filtering transformer having first and second signal conductors and a centertap conductor, wherein the plurality of filtering transformers includes first, second, third and fourth filtering transformers and wherein the centertap of the first filter transformer is electrically connected to a predetermined through hole in the first row, the centertap of the second filter transformer is being electrically connected to a predetermined through hole in the second row, the centertap of the third filter transformer being electrically connected to a predetermined through hole in the first row and the centertap of the fourth filter transformer being electrically connected to a predetermined through hole in the second row.

10. The filtering module of claim 9, wherein the plurality of filtering transformers includes first, second, third and fourth filtering transformers.

11. The filtering module of claim 9, wherein the through holes of each of the first and second arrays are arranged as a plurality of triangular arrays of through holes, the triangular arrays being arranged in an alternating manner such that adjacent arrays are inverted relative to each other.

12. The filtering module of claim 11, wherein each of the plurality of triangular array is electrically connected to the first and second signal conductors and the centertap of corresponding filtering transformer.

13. A filtering module, comprising:

the multi-layer circuit board that includes a conductive reference plane, a linear array of reference through holes interconnected to the reference plane and first and second arrays of through holes positioned on opposite sides of the linear array, each of the first and second arrays of through holes including first and second rows of through holes, the first and second rows being offset in a direction so that each of the rows is generally parallel to the linear array of reference through holes, wherein the through holes of each of the first and second arrays are arranged in a series of first, second, third and fourth triangular arrays of through holes, the triangular arrays being arranged in an alternating manner with the second and fourth triangular arrays being inverted relative to the first and third triangular arrays; and a dielectric housing, wherein the multi-layer circuit board is mounted on the housing; and a magnetics assembly mounted on the housing including a plurality of filtering transformers, each filtering transformer having first and second signal conductors and a centertap conductor.

* * * * *